(12) United States Patent
Shangguan et al.

(10) Patent No.: US 7,796,187 B2
(45) Date of Patent: Sep. 14, 2010

(54) WAFER BASED CAMERA MODULE AND METHOD OF MANUFACTURE

(75) Inventors: Dongkai Shangguan, San Jose, CA (US); Vidyadhar Sitaram Kale, Lake Oswego, OR (US); Samuel Waising Tam, Daly City, CA (US)

(73) Assignee: Flextronics AP LLC, Broomfield, CO (US)

( * ) Notice: Subject to any disclaimer, the term of this patent is extended or adjusted under 35 U.S.C. 154(b) by 996 days.

(21) Appl. No.: 11/247,993

(22) Filed: Oct. 11, 2005

(65) Prior Publication Data

US 2006/0132644 A1 Jun. 22, 2006

Related U.S. Application Data

(63) Continuation-in-part of application No. 10/784,102, filed on Feb. 20, 2004.

(51) Int. Cl.
*H04N 5/225* (2006.01)
(52) U.S. Cl. .................................. 348/374; 348/340
(58) Field of Classification Search ............... 348/340, 348/373, 374; 257/428, 433
See application file for complete search history.

(56) References Cited

U.S. PATENT DOCUMENTS

| | | | |
|---|---|---|---|
| 4,894,707 A | 1/1990 | Yamawaki et al. | |
| 6,122,009 A | 9/2000 | Ueda | |
| 6,384,397 B1 | 5/2002 | Takiar et al. | 250/208.1 |
| 6,476,417 B2 | 11/2002 | Honda et al. | |
| 6,686,588 B1 | 2/2004 | Webster et al. | |
| 6,734,419 B1 | 5/2004 | Glenn et al. | 250/239 |
| 6,741,405 B1 | 5/2004 | Chen | 359/813 |
| 6,798,031 B2 * | 9/2004 | Honda et al. | 257/433 |
| 7,009,654 B2 | 3/2006 | Kuno et al. | |

(Continued)

FOREIGN PATENT DOCUMENTS

CN 1722453 1/2006

(Continued)

OTHER PUBLICATIONS

PCT Application No. PCT/US2006/039521, International Search Report and Written Opinion dated Aug. 2, 2007.

(Continued)

*Primary Examiner*—Gevell Selby
(74) *Attorney, Agent, or Firm*—Henneman & Associates, PLC; Larry E. Henneman, Jr.

(57) ABSTRACT

An integrated camera module (10, 10a) for capturing video images in very small digital cameras, cell phones, personal digital assistants, and the like. A lens assembly (24, 24a) is rigidly affixed in relation to a sensor array area (14) of a camera chip (12) by a molding (26). The molding (26) is formed on the camera chip (12), and optionally on a printed circuit board (16, 16a) on which the camera chip (12) is mounted. The lens assembly (24, 24a) is held in place in a recess (29) of the molding (26) by an adhesive (28). The molding (26) is formed such that a precise gap (30) exists between the lens assembly (24) and a sensor array area (14) of the camera chip (12). In a particular embodiment, lens holders (306, 506) are formed entirely on the camera chips (302, 502) before or after they are separated from one another.

46 Claims, 13 Drawing Sheets

U.S. PATENT DOCUMENTS

| | | | |
|---|---|---|---|
| 7,061,106 B2 * | 6/2006 | Yang et al. | 257/428 |
| 7,091,571 B1 | 8/2006 | Park et al. | |
| 7,122,787 B2 | 10/2006 | Nishizawa | |
| 7,199,438 B2 | 4/2007 | Appelt et al. | |
| 2002/0145676 A1 | 10/2002 | Kuno et al. | |
| 2002/0191103 A1 | 12/2002 | Akimoto et al. | |
| 2003/0137595 A1 | 7/2003 | Takachi | |
| 2003/0146998 A1 | 8/2003 | Doering et al. | |
| 2004/0012698 A1 | 1/2004 | Suda et al. | |
| 2004/0027687 A1 | 2/2004 | Bittner et al. | |
| 2004/0109079 A1 | 6/2004 | Fujimoto et al. | |
| 2004/0189853 A1 | 9/2004 | Takeuchi et al. | 348/340 |
| 2005/0046740 A1 * | 3/2005 | Davis | 348/373 |
| 2005/0185088 A1 * | 8/2005 | Kale et al. | 348/374 |
| 2005/0212947 A1 | 9/2005 | Sato et al. | |
| 2005/0274883 A1 | 12/2005 | Nagano | |
| 2005/0285016 A1 * | 12/2005 | Kong et al. | 250/208.1 |
| 2006/0006486 A1 | 1/2006 | Seo et al. | |
| 2006/0028573 A1 * | 2/2006 | Seo et al. | 348/340 |
| 2006/0044450 A1 * | 3/2006 | Wolterink et al. | 348/340 |
| 2007/0058069 A1 | 3/2007 | Chen et al. | |
| 2007/0278394 A1 | 12/2007 | Shangguan et al. | |

FOREIGN PATENT DOCUMENTS

| | | |
|---|---|---|
| EP | 0813236 | 12/1997 |
| EP | 1429168 | 6/2004 |
| JP | 2001292365 | 10/2001 |
| JP | 2002252796 | 9/2002 |
| JP | 2003078077 | 3/2003 |
| JP | 2003131112 | 5/2003 |
| WO | WO 2004/027880 | 4/2004 |

OTHER PUBLICATIONS

PCT Application No. PCT/US2006/039521, International Preliminary Report on Patentability dated Apr. 24, 2008.
CN Application No. 200680046525.2, Office Action dated Jul. 10, 2009 (English translation).
EP Application No. 06 816 608.1, European Search Report dated Mar. 10, 2010.
U.S. Appl. No. 10/784,102, Information Disclosure Statement dated Mar. 27, 2006.
U.S. Appl. No. 10/784,102, Office Action dated Nov. 24, 2006.
U.S. Appl. No. 10/784,102, Office Action dated Jul. 30, 2007.
U.S. Appl. No. 10/784,102, Information Disclosure Statement dated Oct. 30, 2007.
U.S. Appl. No. 10/784,102, Interview Summary dated Nov. 15, 2007.
U.S. Appl. No. 10/784,102, Office Action dated Dec. 5, 2007.
U.S. Appl. No. 10/784,102, Interview Summary dated May 20, 2008.
U.S. Appl. No. 10/784,102, Office Action dated Sep. 3, 2008.
U.S. Appl. No. 10/784,102, Information Disclosure Statement dated Feb. 27, 2009.
U.S. Appl. No. 10/784,102, Office Action dated Mar. 17, 2009.
U.S. Appl. No. 10/784,102, Office Action dated Jan. 19, 2010.
PCT Application No. PCT/US2005/005139, International Search Report and Written Opinion dated Jun. 12, 2007.
PCT Application No. PCT/US2005/005139, International Preliminary Report on Patentability dated Jul. 10, 2007.
CN Application No. 20058008990.2, Office Action dated Aug. 1, 2008 (English translation).
CN Application No. 20058008990.2, Office Action dated Jun. 12, 2009 (English translation).
EP Application No. 05 713 765.5, Supplementary European Search Report dated Dec. 5, 2008.
EP Application No. 05 713 765.5, Office Action dated Mar. 17, 2009.
JP Application No. 2006-554218, Office Action dated Dec. 9, 2009 (English translation).
U.S. Appl. No. 11/444,277, Office Action dated Aug. 5, 2008.
U.S. Appl. No. 11/444,277, Information Disclosure Statement dated Feb. 5, 2009.
U.S. Appl. No. 11/444,277, Office Action dated May 7, 2009.
U.S. Appl. No. 11/444,277, Office Action dated Nov. 18, 2009.
PCT Application No. PCT/US2007/013014, International Search Report and Written Opinion dated Aug. 27, 2008.
PCT Application No. PCT/US2007/013014, International Preliminary Report on Patentability dated Dec. 18, 2009.
CN Application No. 200780026542.4, Office Action dated Nov. 13, 2009 (English translation).

* cited by examiner

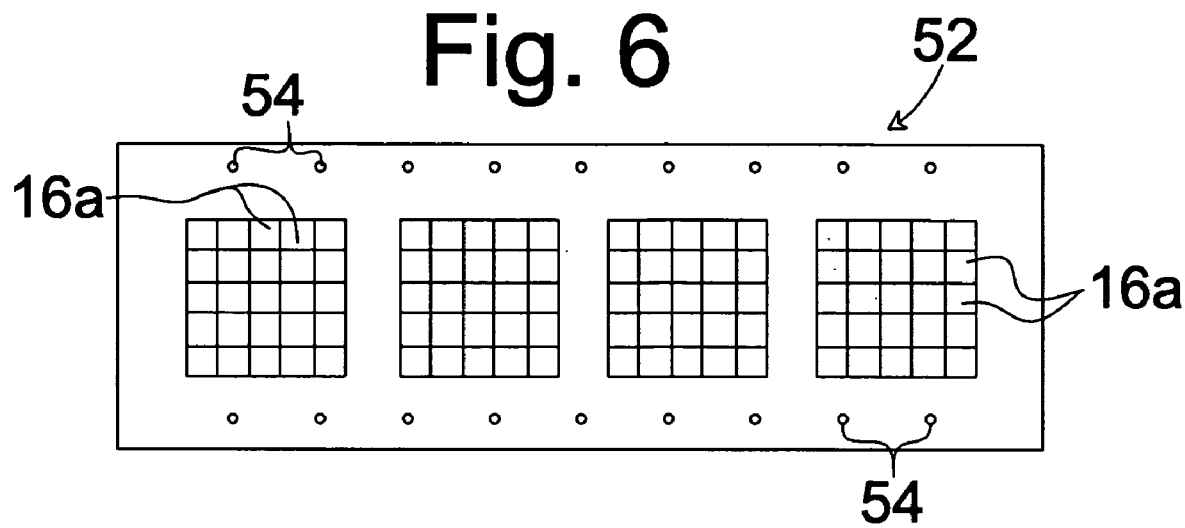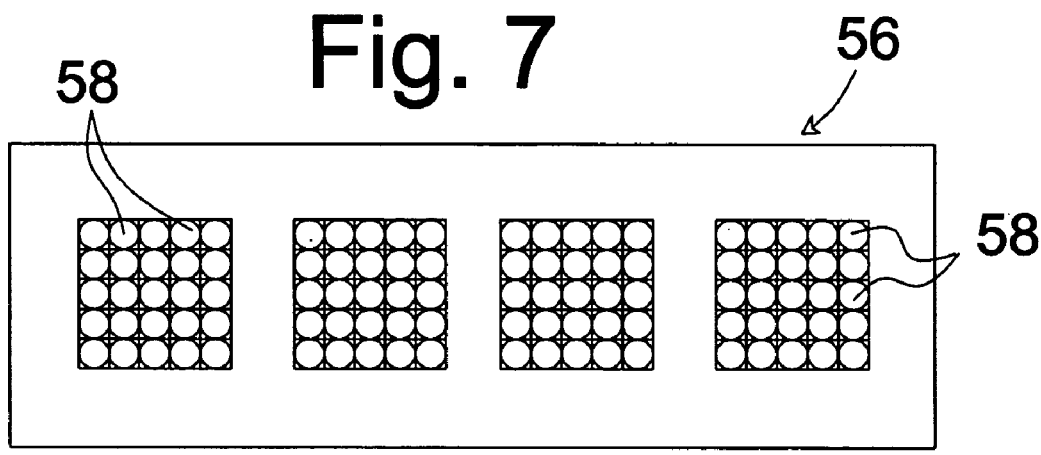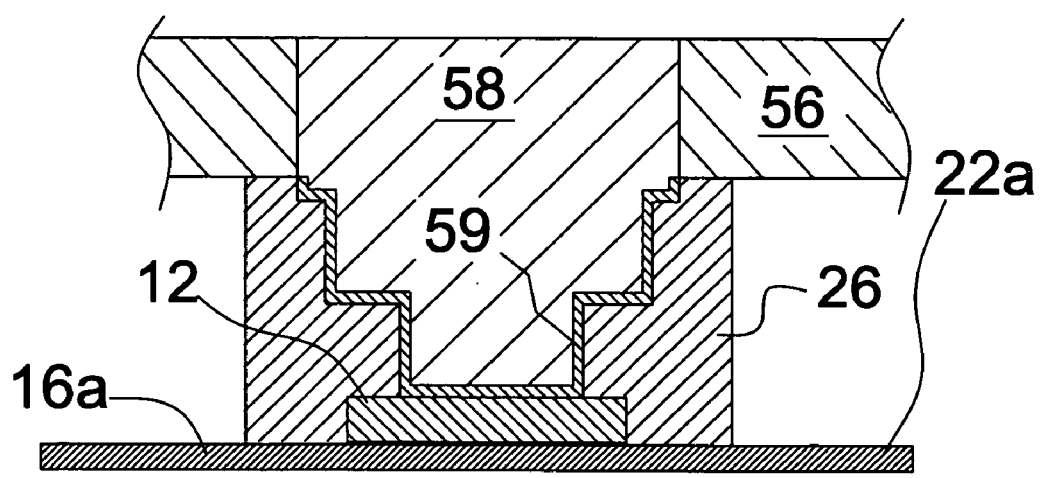

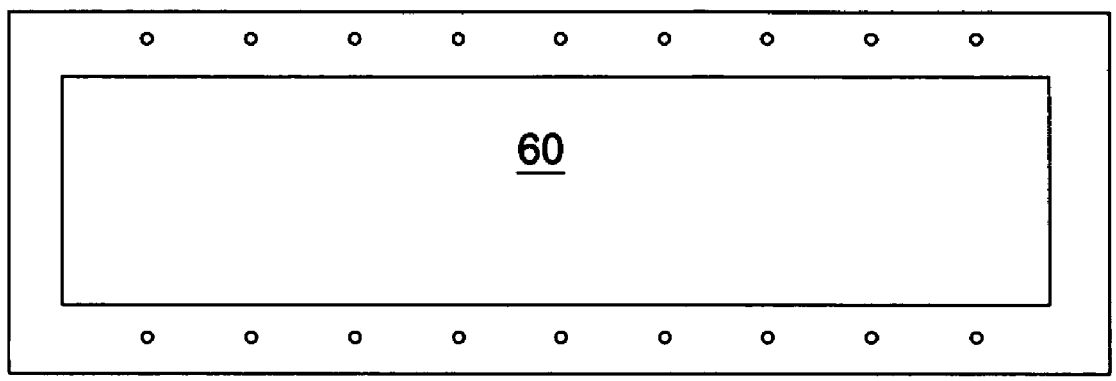
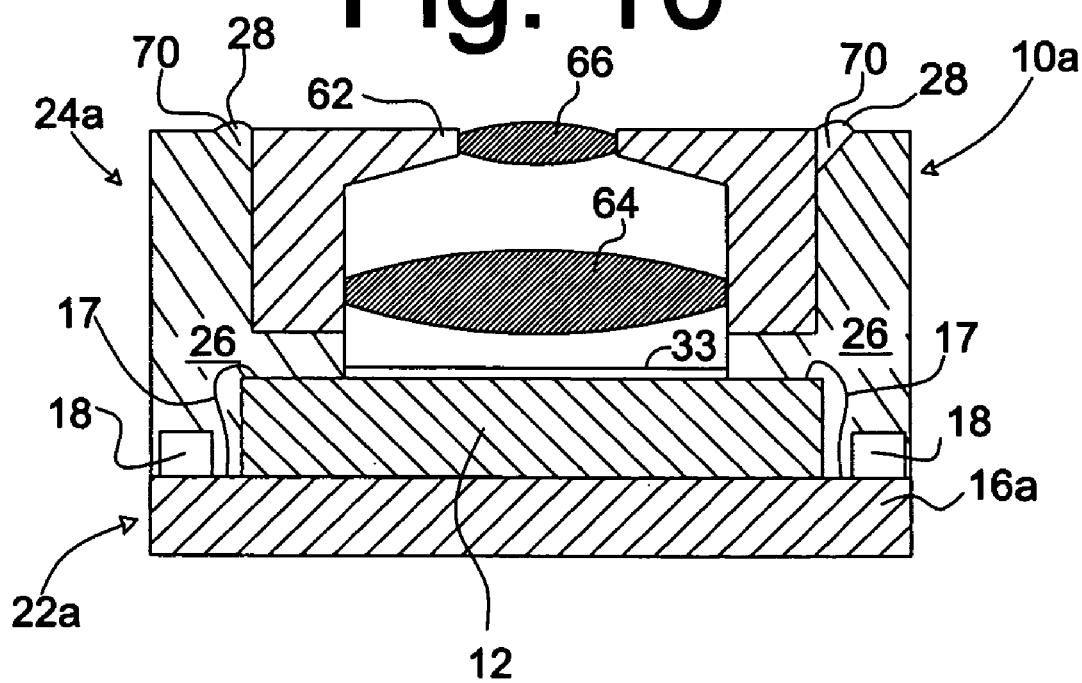

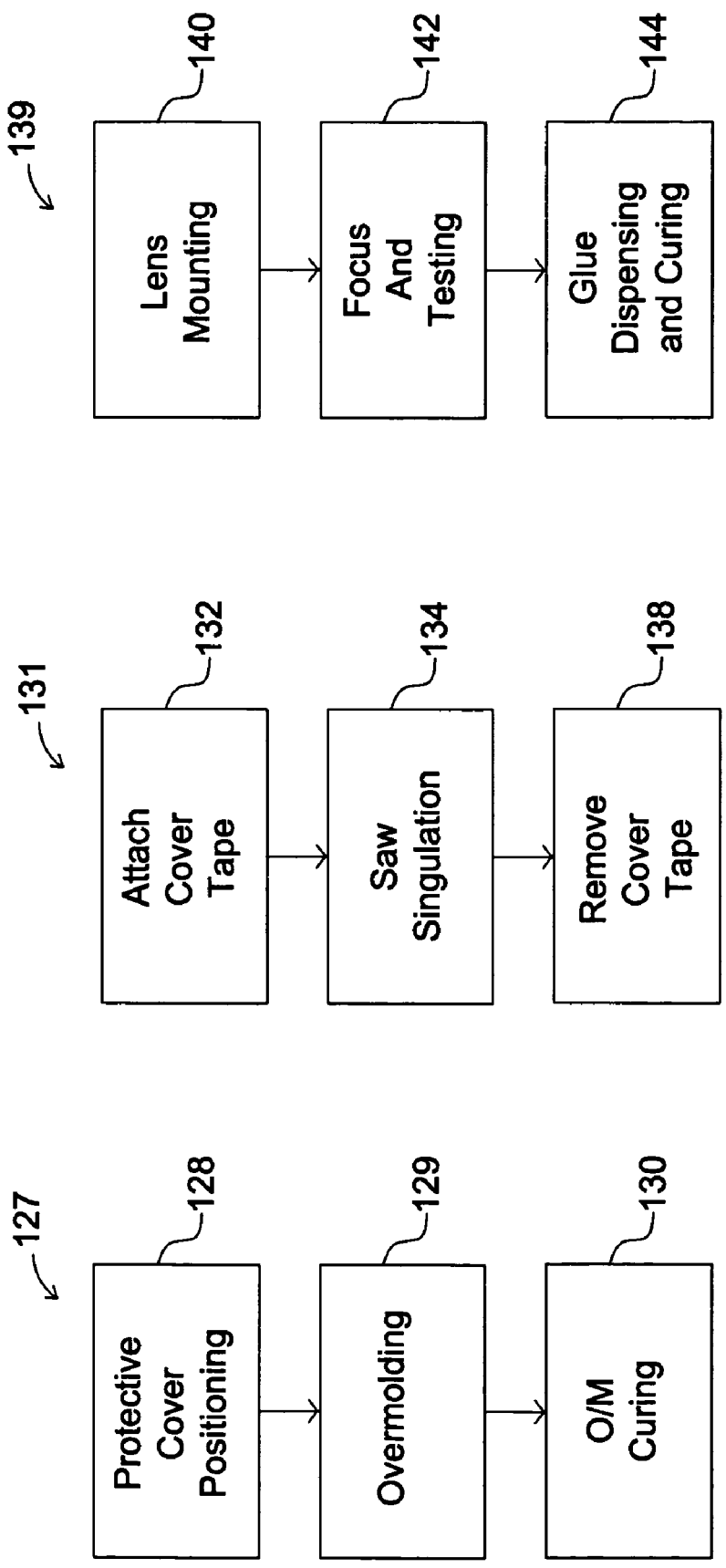

WAFER BASED CAMERA MODULE AND METHOD OF MANUFACTURE

RELATED APPLICATIONS

This application is a continuation-in-part of co-pending U.S. patent application Ser. No. 10/784,102, filed Feb. 20, 2004 by the same inventors, which is incorporated herein by reference in its entirety.

BACKGROUND OF THE INVENTION

1. Field of the Invention

The present invention relates generally to the field of digital camera devices, and more particularly to a novel combined array chip and lens apparatus. The predominant current application for the inventive integrated lens and chip assembly is in the production of low cost cameras, wherein the ability to produce high quality pictures without expensive or complicated camera assemblies is an important factor.

2. Description of the Background Art

Very small digital camera modules, adapted for use in small inexpensive cameras, cell phones, hand held devices, and the like, are greatly in demand. In the prior art, such modules have included generally conventional integrated chip and/or chip on board assemblies, which are enclosed in a mechanical housing. A lens block or assembly is attached to the chip housing and mechanically aligned thereto. This arrangement requires a significant quantity of parts used in the attachment process. It also generally requires some sort of attachment apparatus or jig for holding the pieces in alignment while they are attached. It is also very labor intensive. Additionally, the attachment mechanism is generally rather delicate and can easily be jarred out of position if the resulting device is dropped, or the like.

It would be desirable to have a method for producing a camera module which is small in size, inexpensive to manufacture, and durable and reliable in operation. However, to the inventors' knowledge, the above described arrangement of components is that being used in the production of such devices prior to the advent of the presently described invention.

SUMMARY

Accordingly, it is an object of the present invention to provide a camera module which is easy and inexpensive to manufacture.

It is another object of the present invention to provide a camera module which can be very small in size.

It is still another object of the present invention to provide a camera module, which is rugged and reliable in operation.

It is yet another object of the present invention to provide a camera module in which the lens is accurately located, thereby providing for optimal picture quality without the need for active alignment.

Briefly, an example of the present invention has a lens assembly, which is rigidly affixed in relationship to a camera chip using a molded component, which serves as a lens holder. The molded component is formed in place on a printed circuit board on which the camera chip is already mounted. The lens assembly is then inserted into the molded component and held in place therein by an adhesive. According to the present inventive method and apparatus, a lens is accurately affixed in relationship to a sensor surface of the camera chip using a minimum of components and a minimum of operation steps. The size of the resulting unit can be quite small and the unit is also rugged and reliable in operation.

In an alternate embodiment of the present invention, the lens holder is mounted entirely on the camera chip (within the peripheral limits of the camera chip) rather than on both the printed circuit board and the camera chip. In this embodiment, the camera chip and lens holder combination can be mounted on the printed circuit board together as a single unit. Additionally, a lens assembly can be positioned within the lens holder before or after the camera chip is affixed to the printed circuit board, or even while the camera chips are still an integral part of the silicon wafer from which they are fabricated.

The alternate camera module includes an image capture integrated circuit chip (camera chip), a lens unit, and a lens holder mounted on the image capture integrated circuit chip, whereby the lens is positioned relative to the image capture integrated circuit chip. The lens holder can be mounted to the image capture integrated circuit chip in any number of ways including, without limitation, molding the lens holder directly on the image capture chip or preforming the lens holder and adhering the preformed lens holder to the image capture chip.

The lens is positioned with respect to the image capture integrated circuit chip by positioning the lens into a receiving portion of the lens holder. The distance between the lens and the image capture integrated circuit chip is set by a reference surface that abuts the lens (or a portion of an assembly in which the lens is incorporated). Alternatively, if the ability to focus is desirable in a particular application, a focus mechanism (complimentary inclined surfaces) can be provided between the lens holder and the lens unit. As yet another option, the lens can be incorporated into the lens holder prior to mounting the lens holder on the image capture integrated circuit chip.

The alternate camera module also includes a plurality of electrical contacts for connecting the camera module to a host electronic device (e.g., a circuit board of a mobile telephone). Depending on the relative sizes of the image capture integrated circuit chip and the lens holder, the electrical contacts can be positioned on the top surface of the integrated circuit chip, the bottom surface of the integrated circuit chip, or some combination thereof. For example, if the maximum width of the lens holder is substantially the same as the width of the image capture integrated circuit chip, then there may not be sufficient area on the top surface of the chip for the electrical contacts. In that case, at least some of the electrical contacts can be formed on the bottom surface of the integrated circuit chip and connected to the circuitry formed in the top surface of the integrated circuit chip by vias formed through the integrated circuit chip. However, if there is sufficient area, then the electrical contacts can be formed on exposed portions of the top surface of the integrated circuit chip.

Novel methods for manufacturing camera modules are also disclosed. One particular method includes providing a substrate (e.g., a silicon wafer) having a plurality of discrete image capture devices formed thereon, and then fixing a plurality of lens holders on the substrate, each lens holder being fixed on a respective one of the image capture devices. In a particularly efficient method, the lens holders are fixed (e.g., molded, adhered, etc.) onto the image capture devices simultaneously, before the image capture devices are separated from one another. Similarly, lens units (a bare lens, lens barrel, etc.) can be fixed into the lens holders prior to singulation of the wafer. In addition, if focusing is required, focusing can be performed prior to singulation. Thus, using the disclosed methods camera module assembly is incorporated into the wafer processing stage, whereby multiple, wafer-level camera modules can be manufactured at one time.

These and other objects and advantages of the present invention will become clear to those skilled in the art in view of the description of modes of carrying out the invention, and the industrial applicability thereof, as described herein and as illustrated in the several figures of the drawing. The objects and/or advantages listed or discussed herein are not an exhaustive list of all possible objects or advantages of the invention. Moreover, it will be possible to practice the invention even where one or more of the intended objects and/or advantages might be absent or not required in the application.

Further, those skilled in the art will recognize that various embodiments of the present invention may achieve one or more, but not necessarily all, of the above described objects and/or advantages. Accordingly, the listed objects and advantages are not essential elements of the present invention, and should not be construed as limitations.

BRIEF DESCRIPTION OF THE DRAWINGS

FIG. 6 is a top plan view of a substrate strip such as can be used to implement the present invention;

FIG. 7 is a top plan view of a molding chase such as can be used to implement the present invention;

FIG. 8 is a cross sectional side elevational view of one of the mold inserts of FIG. 7;

FIG. 9 is a top plan view showing the substrate strip of FIG. 6 with a protective tape in place thereon;

FIG. 10 is a cross sectional side elevational view of an alternative example of the inventive integrated camera and lens assembly;

FIG. 13 is a flow chart summarizing one particular method for performing an overmolding lens mount step of FIG. 11;

FIG. 14 is a flow chart summarizing one particular method for performing a device separation step of FIG. 11;

FIG. 15 is a flow chart summarizing one particular method for performing a lens mounting step of FIG. 11;

DETAILED DESCRIPTION

Figure 1:
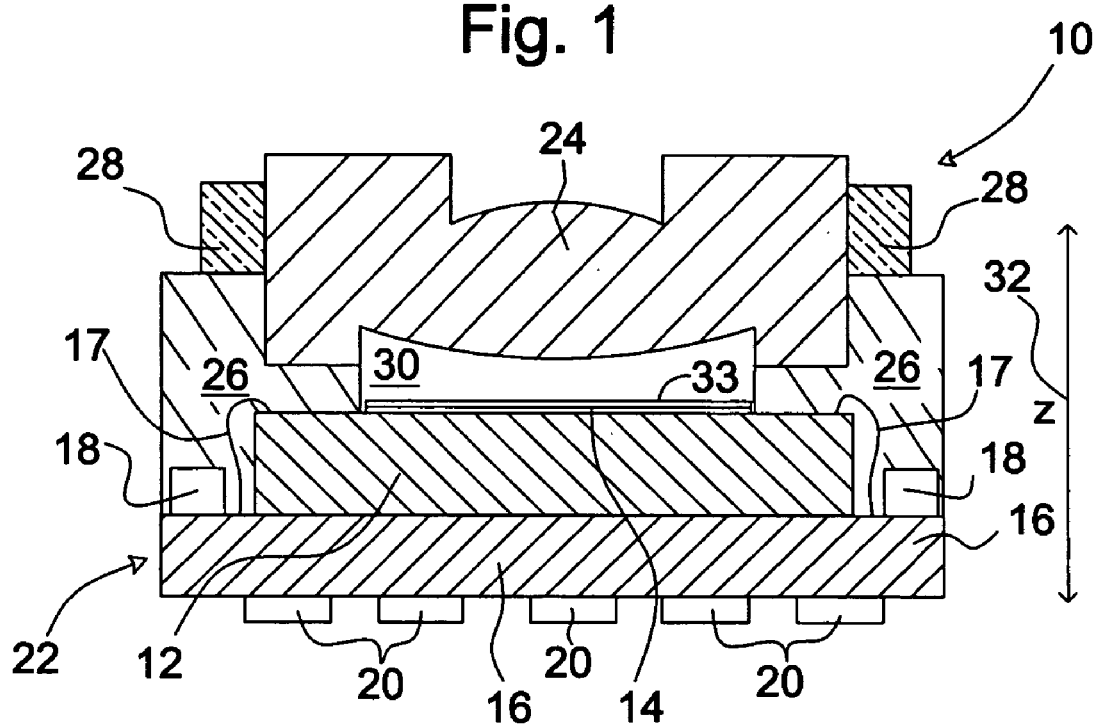
FIG. 1 is a cross sectional side elevational view of an example of an integrated camera and lens assembly according to the present invention.

This invention is described in the following description with reference to the Figures, in which like reference numbers represent the same or similar elements. While this invention is described in terms of modes for achieving this invention's objectives, it will be appreciated by those skilled in the art that variations may be accomplished in view of these teachings without deviating from the spirit or scope of the present invention. The embodiments and variations of the invention described herein, and/or shown in the drawings, are presented by way of example only and are not limiting as to the scope of the invention. Unless otherwise specifically stated, individual aspects and components of the invention may be omitted or modified, or may have substituted therefore known equivalents, or as yet unknown substitutes such as may be developed in the future or such as may be found to be acceptable substitutes in the future. The invention may also be modified for a variety of applications while remaining within the spirit and scope of the claimed invention, since the range of potential applications is great, and since it is intended that the present invention be adaptable to many such variations.

In the following description, details of some well known and/or commonly commercially available component parts have not been specifically discussed in detail, so as to avoid unnecessary complexity which might obscure disclosure of the true nature of the present invention. It should be noted that the diagrammatic representations in the drawings accompanying this description are not necessarily drawn in the scale and proportion which might be used in the actual practice of the invention. Rather the drawings are intended only to demonstrate the relative arrangement of certain aspects of the invention and to assist in the understanding of the important inventive aspects.

A known mode for carrying out the invention is an integrated camera module. The inventive integrated camera module is depicted in a side elevational view in FIG. 1 and is designated therein by the general reference character 10. The integrated camera module 10 has a camera chip 12 which is, in and of itself, not different from other camera chips such as are now in use or such as might be developed in the future. One skilled in the art will recognize that the camera chip 12 will have thereon a sensor array area 14 and will also contain many of the additional components (timing, and the like) necessary or desirable for causing the sensor array area 14 to capture an image. In the example of FIG. 1 the camera chip 12 is attached (as will be discussed in greater detail hereinafter) to a printed circuit board ("PCB") 16. The camera chip 12 is electrically connected to the PCB 16 by a plurality (only two of which are visible in the view of FIG. 1) of wire bond attachment wires 17.

The PCB 16 has thereon a plurality of passive components 18 which, in conjunction with components on the camera chip 12, constitute the internal circuitry of the integrated camera module 10. Optionally, the PCB 16 can, in some applications, have a plurality (only a few of which are shown in the view of FIG. 1 for the sake of clarity) of bottom contact pads 20 for connecting the integrated camera module 10 electrically to external components (not shown), such as an operating button, optional flash circuitry, external digital memory, external control circuitry, or the like. Together, the above described components form a PCB assembly 22 which, in many respects, is not significantly different from those currently in use in similar camera modules.

According to the present invention, a lens assembly 24 is positioned in relation to the PCB assembly 22 by molding 26 and held in place therein by an adhesive 28. The molding 26 is formed by a molding material on the PCB assembly 22 as will be discussed in greater detail hereinafter. The molding 26 has dimensional tolerances sufficiently accurate such that when the lens assembly 24 is positioned within a recessed area 29 (FIG. 2) in the molding 26, as shown in the example of FIG. 1, then a gap 30 is appropriate for the focus of the lens assembly 24 in relation to the PCB assembly 22. Optimal distance between the lens assembly 24 and the sensor array area 14 is determined by the geometry and materials of the particular lenses used. The height of the gap 30 is a function of the placement of the lens assembly 24 in a Z dimension 32, as can be seen in the view of FIG. 1, which placement will be discussed in greater detail hereinafter.

Note that lens assembly 24 is not intended to depict any particular lens design, but rather is shown representationally for illustrative purposes. Depending on the particular design, lens assembly 24 can be formed from a single piece of material, can include one or more lenses mounted in a carrier (e.g., FIG. 10), or can include additional optical components.

A protective cover 33 is mounted over sensor array area 14, to protect sensor array area 14 from damage during the manufacturing and assembly process. Preferably, protective cover 33 is formed from a robust, optically inactive material. In one particular embodiment, protective cover is a glass cover sheet, which can be mounted over sensor array area 14 either before or during the formation of molding 26.

Figure 2:
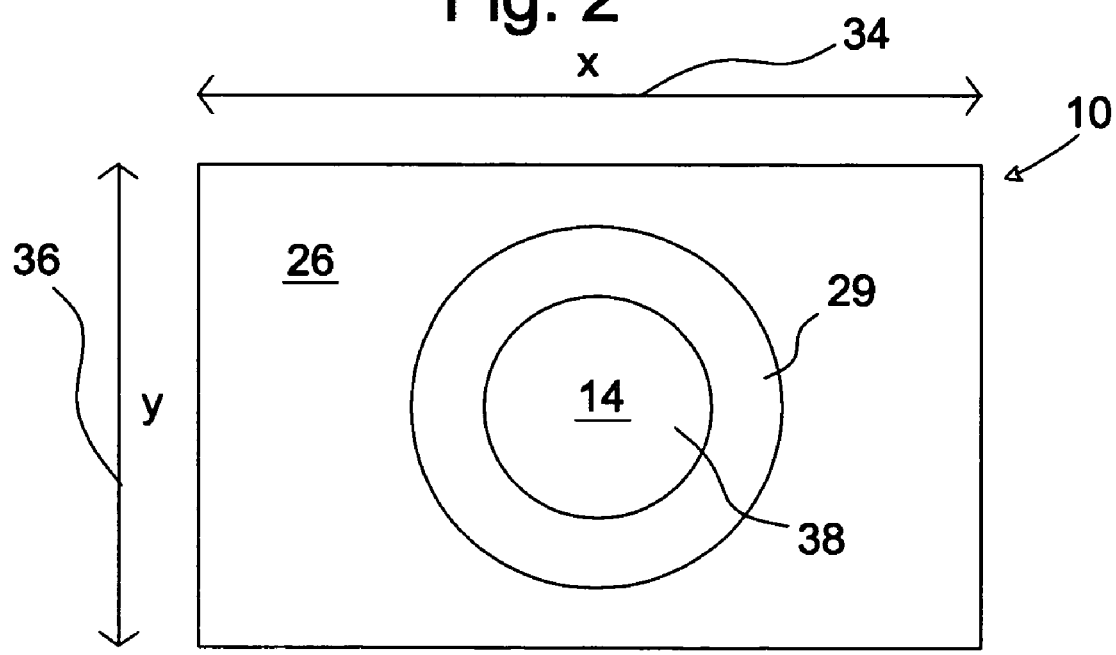
FIG. 2 is a top plan view of a partially assembled integrated camera and lens assembly according to the present invention.

FIG. 2 is a diagrammatic top plan view of the integrated camera module 10 of FIG. 1 before the lens assembly 24 is positioned thereon. As can be seen in the view of FIG. 2, placement of the lens assembly 24 (FIG. 1) in an X dimension 34 and a Y dimension 36 is accomplished by the position and tolerances of the recessed area 29 in the molding 26. An aperture 38 in the molding 26 is provided such that the sensor array area 14 can be seen there through.

Figure 3:
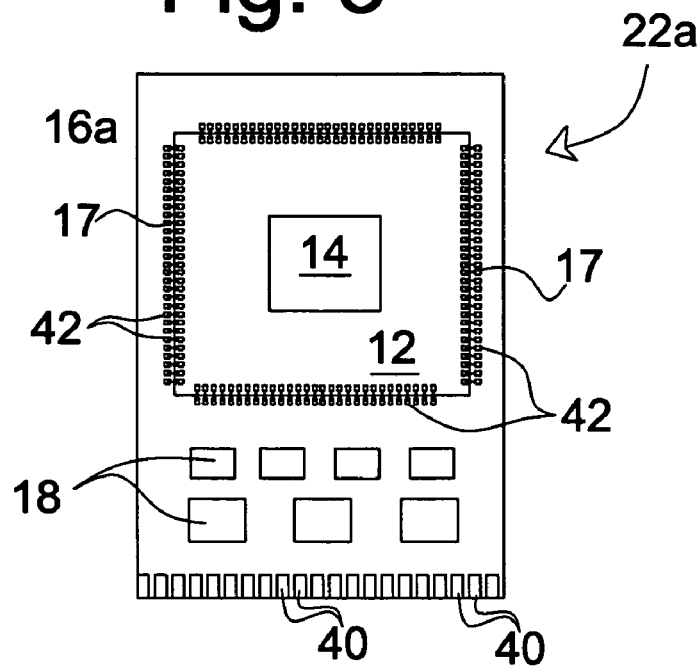
FIG. 3 is a top plan view of another example of a PCB assembly according to the present invention.

FIG. 3 is a top plan view of another example of a PCB assembly 22a. In the example of FIG. 3 it can be seen that the camera chip 12 is affixed (by an adhesive, in this example) to the alternate PCB 16a. A great plurality of the attachment wires 17 are connected to a like plurality of attachment pads 42 on the alternate PCB 16a for making electrical connection between the alternate PCB 16a and the camera chip 12. The alternate PCB assembly 22a also has a plurality of attachment fingers 40 thereon for electrically connecting the alternate PCB assembly 22a to external circuitry. Unlike the example of FIG. 1, in the example of FIG. 3, all of the passive components 18 are located on one side of the camera chip 12.

Figure 4:
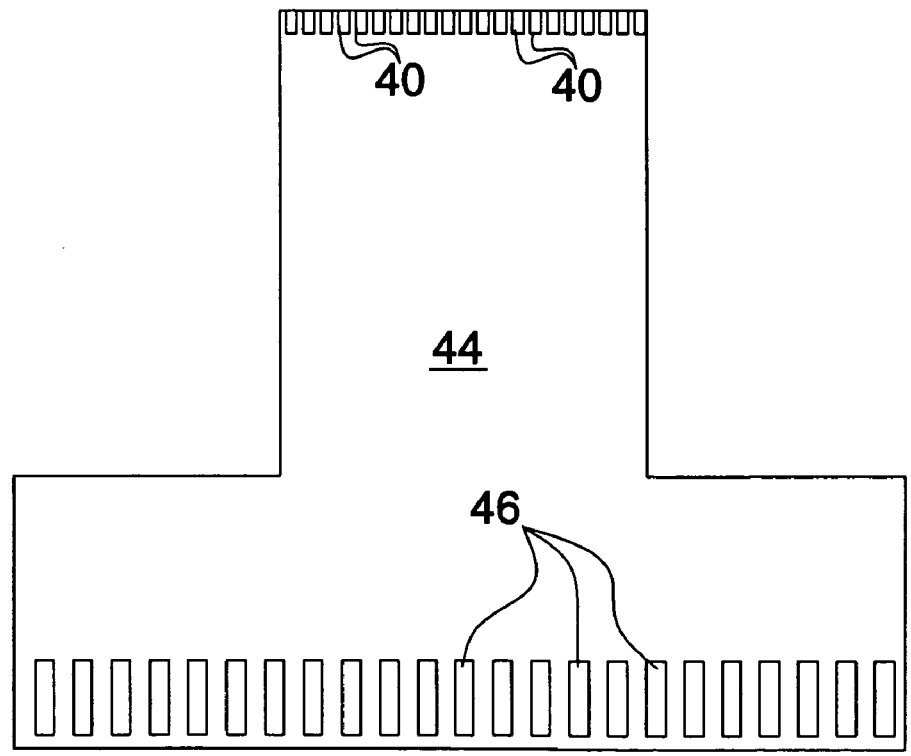
FIG. 4 is a bottom plan view of a flexible connector according to the present invention.

FIG. 4 is as bottom plan view of a flex circuit 44. The flex circuit 44 has a plurality of the attachment fingers 40 thereon for mating with the like plurality of attachment fingers 40 on the alternate PCB assembly. Furthermore, the flex circuit 44 has a plurality of edge connector pads 46 for connection to external circuitry.

Figure 5:
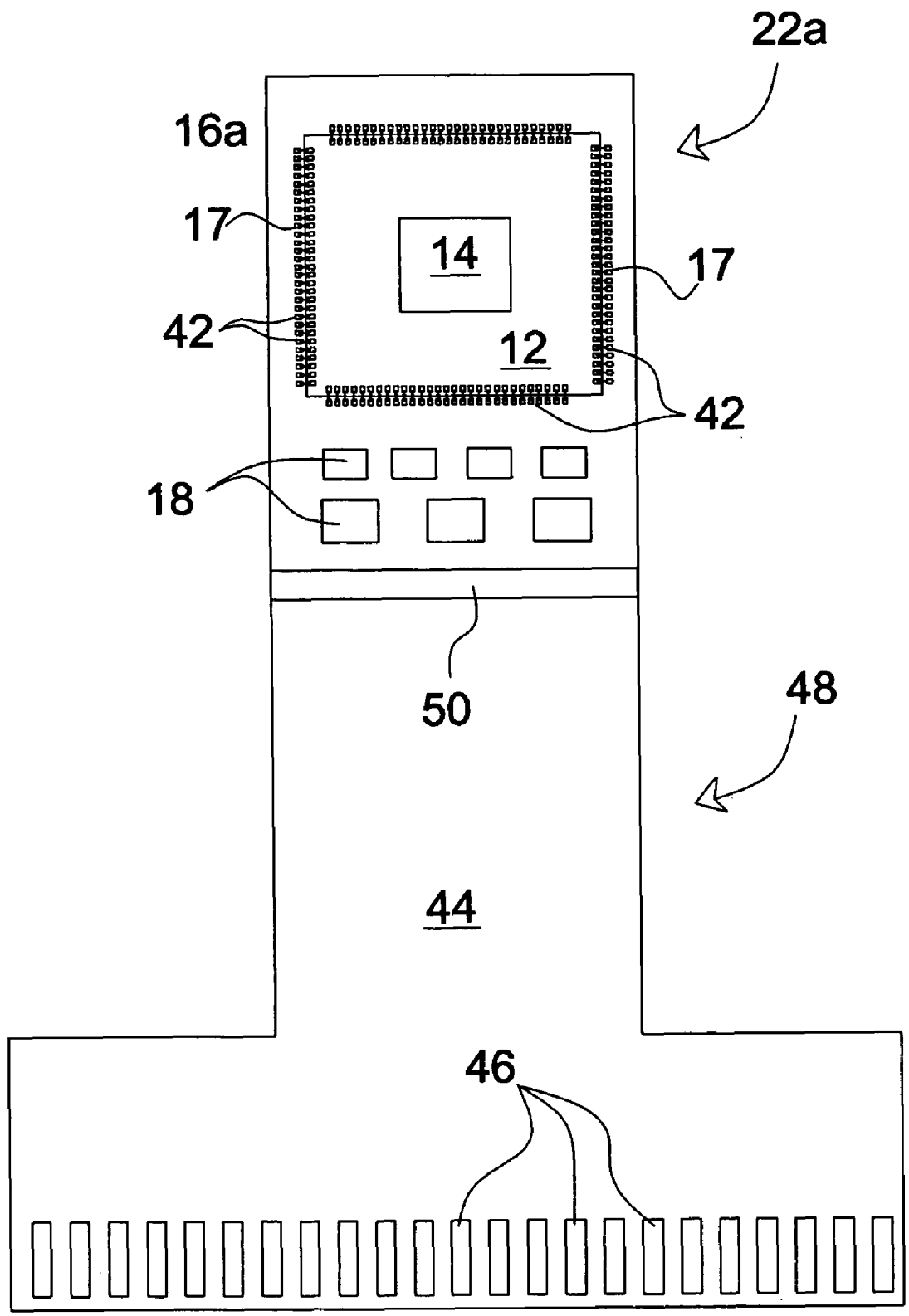
FIG. 5 is a top plan view of an assembled flexible PCB apparatus.

FIG. 5 is a top plan view of an assembled flex circuit assembly 48 having the alternate PCB assembly 22a of FIG. 3 affixed to the flex circuit 44 of FIG. 4. It should be noted that the alternate PCB assembly 22a could be attached directly to a rigid circuit board, or the like, without the flex circuit 44. However, in some applications, the flex circuit 44 will allow more freedom in the placement of the alternate PCB assembly 22a. Furthermore, additional circuitry can be included on the flex circuit 44 as may be necessary or required. The flex circuit 44 will include traces (not shown) for providing electrical connection between the attachment fingers 40 and the edge connector pads 46 and, as discussed above, optional additional circuitry as required. In the view of FIG. 5 it can be seen that, in the flex circuit assembly 48, the alternate PCB assembly 22a is connected to the flex circuit 44 at a hot bar attachment point 50 such that the attachment fingers 40 (not visible in the view of FIG. 5) mate as required. One skilled in the art will be familiar with the hot bar attachment method whereby the components are joined at the hot bar attachment point 50.

FIG. 6 is a top plan diagrammatic view of a substrate strip 52. The substrate strip 52 has a plurality (100 in the example shown) of the individual PCBs 16a included therein. The substrate strip 52 also has a plurality (18 in this example) of alignment holes 54 for aligning the substrate strip 52 in one or more placement jigs (not shown).

FIG. 7 is a top plan diagrammatic view of a mold chase 56 such as might be used to accomplish the present invention. The mold chase 56 is constructed of a metal such as stainless steel. The mold chase as adapted for holding in place a plurality (100 in this example) of mold inserts 58. The mold inserts 58 are positioned such that one mold insert 58 is correctly aligned over each of the PCBs 16a on the substrate strip 52 (FIG. 6) when the mold chase 56 is aligned over the substrate strip 52.

FIG. 8 is a diagrammatic side elevational view of one of the mold inserts 58 in position over one of the alternate PCB assemblies 22a. As will be discussed in greater detail hereinafter, the alternate PCB assemblies 22a are constructed on the substrate strip 52, except as noted herein, before the substrate strip 52 is separated into the individual alternate PCB assemblies 22a. As can be seen in the view of FIG. 8, mold insert 58 is coated with a compliant, non-adherent layer of material 59, to prevent damage to the underlying sensor 12 and/or to prevent adhesion of the molding 26 material to mold insert 58. The specific material used for coating 59 will depend on the specific composition of molding 26, as is known to those skilled in the art, and in some applications, coating material 59 can be omitted. Thus, coating material 59 is not considered to be an essential element of the present invention. It should be noted that the molding process, itself, is not peculiar to the present invention. In place molding techniques are well known in the art, and one skilled in the art will be familiar with the details necessary to properly form the molding 26 and equivalents discussed herein.

FIG. 9 is a top plan view of an example of the substrate strip 52 with a protective tape 60 in place thereon to protect the PCB assemblies 16a (not visible in the view of FIG. 9) during some assembly of the invention. Use of the protective tape 60 will be discussed in greater detail hereinafter in relation to the inventive method for producing the integrated camera module 10.

FIG. 10 is yet another example of an integrated camera module 10a according to the present invention. In the view of FIG. 10 it can be seen that an alternate lens assembly 24a has a plastic lens housing 62, a first lens 64 and a second lens 66. One skilled in the art will recognize that the integrated camera module 10a will generally require two lenses. Therefore, an arrangement such as is illustrated in the view of FIG. 10 is considered by the inventors to be optimal. However, the invention can be practiced using only one lens. The distance between the first lens 64 and the second lens 66 is fixed by the construction of the lens housing 62. The distance between the first lens 64 and the camera chip 12 is set as will be discussed hereinafter. In the example of FIG. 10, an adhesive well 70 is provided around the circumference of the molding 26 for accepting the adhesive 28 which holds the lens assembly 24a in place within the molding 26.

Figure 11:
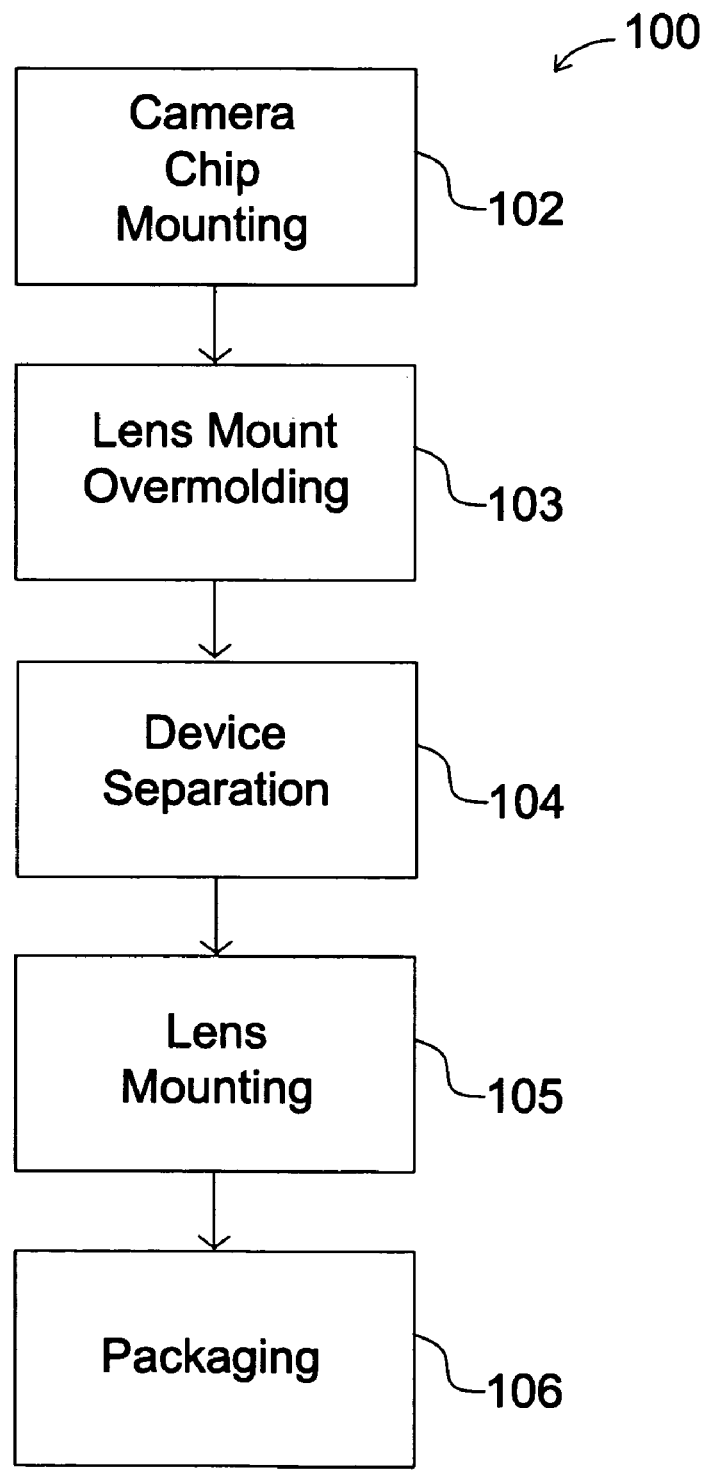
FIG. 11 is a flow diagram depicting the inventive method for producing an integrated camera and lens assembly.

FIG. 11 is a flow diagram depicting an example of the present inventive camera module construction method 100. In this particular example, a plurality of camera modules are constructed at the same time. First, in a "camera chip mounting" operation 102, one or more camera chips 12 are mounted to one or more PCBs 16a, respectively (FIG. 6). Next, in a "lens mount overmolding" operation 103, a lens mount 26 is molded over each camera chip 12. Then, in a "device separation" operation 104, the PCBs 16a are separated (e.g., sawn apart) from one another. Next, in a "lens mounting" operation 105, a lens housing 62 is mounted into each lens mount molding 26 (FIG. 10). Finally, in a "packaging" operation 106, the completed integrated camera modules 10a are packaged for shipment to the makers of miniature cameras, telephone cameras, and the like, or optionally for attachment to the flex circuit 44 as previously discussed herein.

Figure 12:
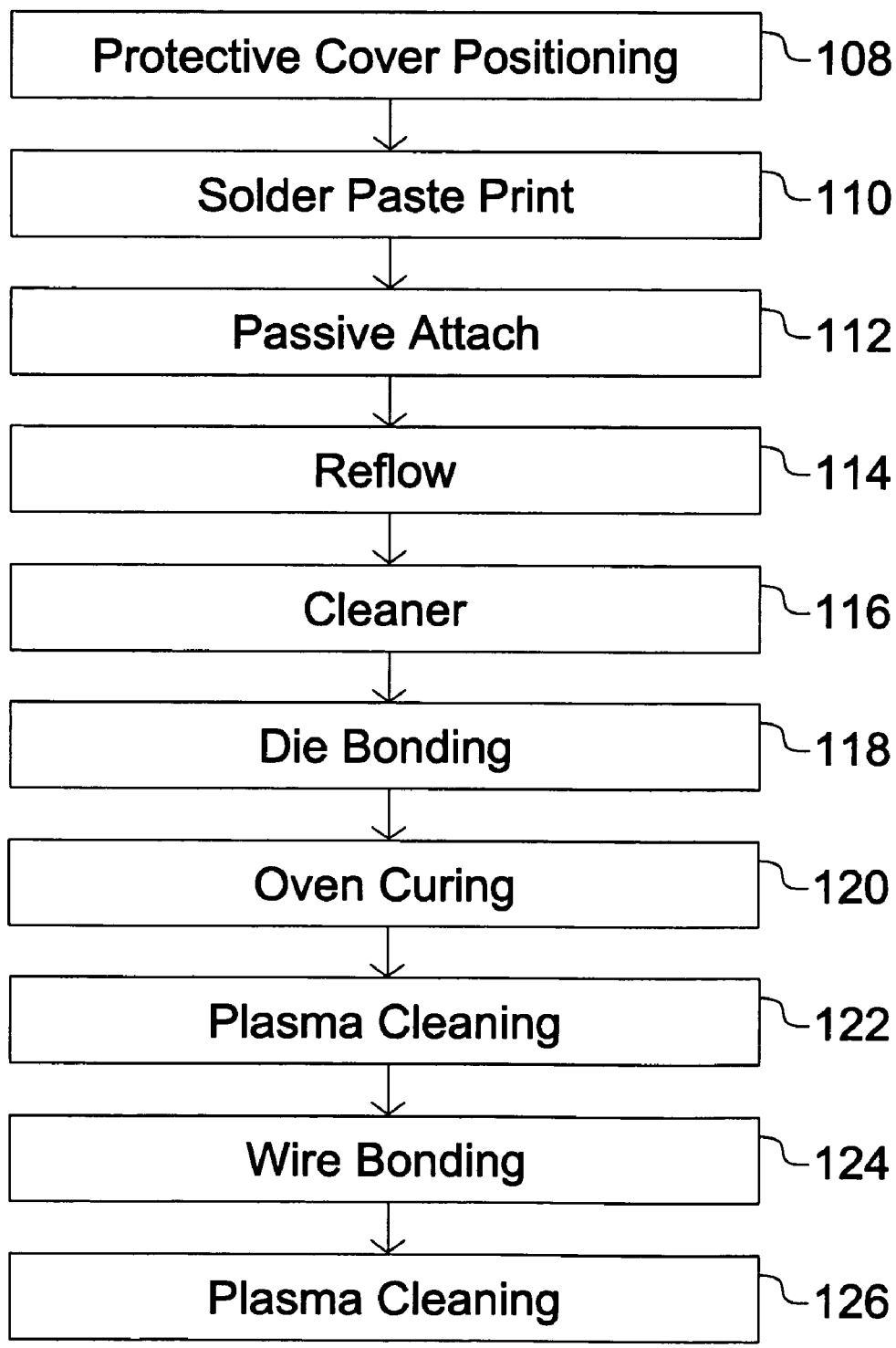
FIG. 12 is a flow chart summarizing one particular method for performing a camera chip mounting step of FIG. 11.

FIG. 12 is a flow chart summarizing one particular method 107 for performing camera chip mounting operation 102 of method 100. First, in a "protective cover position" operation 108, protective cover 33 is positioned over camera chip 12 (FIG. 10). Optionally, protective cover 33 can be positioned during lens mount overmolding operation 103, at another point in camera chip mounting operation 102, or omitted. Next, in a "solder paste print" operation 110 solder paste traces are printed on the individual PCBs 16a of the substrate strip 52. In a "passive attach" operation 112 the passive components 18 are placed on the PCBs 16a. In a "reflow" operation 114, the substrate strip 52 is subjected to a reflow soldering operation, and in a "cleaner" operation 116, the substrate strip 52 is subjected to conventional cleaning following the reflow soldering process 114.

In a "die bonding" operation 118 the camera chips 12 are bonded (by an adhesive in this example) to the respective PCBs 16a. In an "oven curing" operation 120, the adhesive applied in the previous operation is cured in an oven. In a "plasma cleaning" operation 122 surfaces to which wires are to be bonded (in subsequent operations) are etched using inert gasses. In a "wire bonding" operation 124 the attachment wires 17 are bonded using thermosonic bonding. In a second "plasma cleaning" operation 126 the PCBs 16a are again cleaned.

FIG. 13 is a flow chart summarizing one particular method 127 of performing lens mount overmolding operation 103 of method 100. In a protective cover positioning operation 128, protective cover 33 is positioned over camera chip 12. Note that this step is unnecessary if protective cover 33 has already been mounted as part of a prior process, or if no protective cover is desired. Then, in an "over molding" operation 129, the mold chase 56 is placed over the substrate strip 52 and the molding 26 is formed as previously discussed herein. In addition to the functionality already described herein, molding 16 can also serve to hold protective covering 33 in place, essentially sealing in the sensor array area 14 of camera chip 12. The molding 26 is formed using generally conventional "overmolding" techniques known to those skilled in the art. The mold will provide for exposure of the sensor array area 14 of the camera chip 12 after the molding operation. Finally, in an "O/M curing" operation 130, the molding 26 is briefly heat cured.

FIG. 14 is a flow chart summarizing one particular method 131 of performing device separation operation 104 of FIG. 11. First, the protective tape 60 is placed over all of the PCBs 16a (as illustrated in FIG. 9) in an "attach cover tape" operation 132. Then, in a "saw singulation" operation 134, the individual PCBs 16a are sawn apart. The sawing is done right through the protective tape 60 such that the resulting product is a plurality of the individual PCB assemblies 22a, each having a respective portion of the protective tape 60 still in place thereon. The protective tape 60 is a commonly available commodity provided for protecting components during a soldering process, and the like. Finally, in a "remove cover tape" operation 138, the bits of the protective tape 60 are removed from each of the PCB assemblies 22a.

FIG. 15 is a flow chart summarizing one particular method 139 of performing lens mounting operation 105 of method 100. In a "lens mounting" operation 140, one of the lens assemblies 24a is inserted into each of the moldings 26 (FIG. 10). In a "focus and testing" operation 142, the lens assembly 24a is moved up and down (along the Z axis 32 of FIG. 1) to perfect the focus of the lens assembly 24a in relation to the sensor array area 14 of the camera chip 12. Correct focus is determined by generally conventional automatic testing equipment. It should be noted that the inventors believe that this operation might be eliminated in the future by referencing the position of the mold chase 56 in relation to the camera chip 12 during the "over molding" operation 128. Finally, in a "glue dispensing and curing" operation 144, ultra violet cure adhesive 28 is applied as previously discussed herein, and then cured using ultra violet light.

Figure 16:
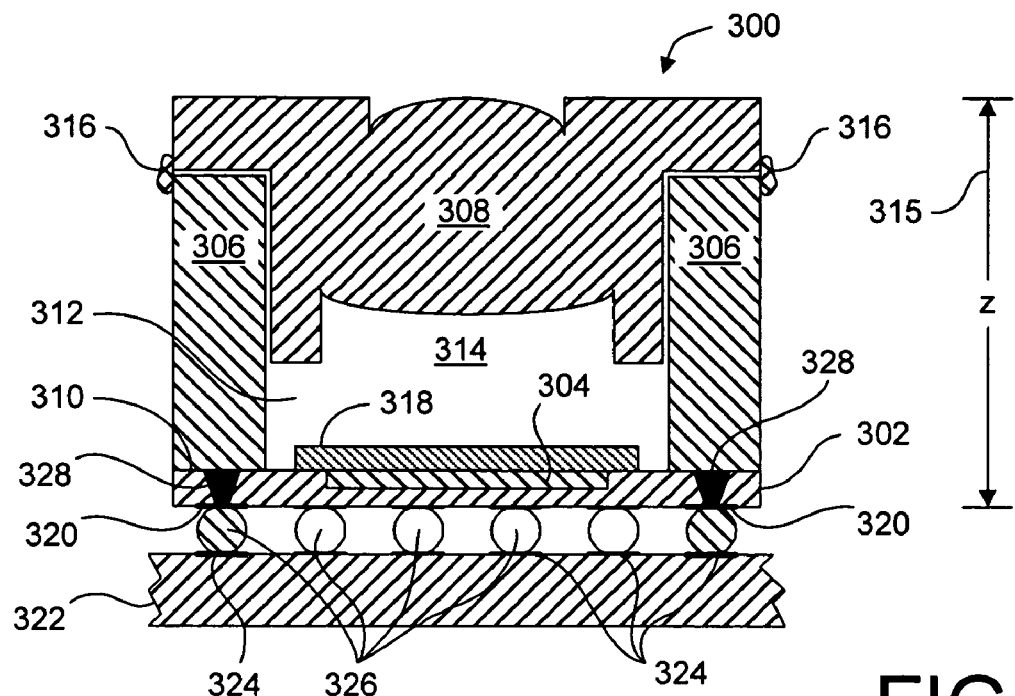
FIG. 16 is a cross-sectional side elevational view of a camera module and lens assembly according to another embodiment of the present invention.

FIG. 16 is a cross-sectional, side elevational view of a camera module 300 according to an alternate embodiment of the present invention. Camera module 300 includes an image capture device 302 (e.g., an integrated circuit camera chip) having a sensor array area 304, a lens holder 306 (e.g., a molded housing) formed entirely on image capture device 302, and a lens assembly 308 seated in lens holder 306. In the present embodiment, lens holder 306 is formed on the top surface 310 of image capture device 302 within the peripheral limits of top surface 310, and defines a recess 312 that receives lens assembly 308 and positions lens assembly 308 with respect to sensor array area 304. Sensor array area 304 is operative to convert an optical image focused thereon by lens assembly 308 into electrical signals, such that image capture device 302 can convert the optical image into digital image data and provide the digital image data to circuitry of a host electronic device (not shown), for example, a cell phone, PDA, etc.

Lens assembly 308 is affixed to and positioned with respect to image capture device 302 via lens holder 306. In the present embodiment, lens assembly 308 is laterally aligned by recess 312 and vertically supported by lens holder 306 such that a gap 314 is defined between lens assembly 308 and sensor array area 304. The top surface of lens holder 306 serves as a reference surface that positions lens assembly 308 a predetermined distance from sensor array area 304 along a z direction 315, so that an image transmitted by lens assembly 308 is properly focused on sensor array area 304. Optionally, an alternate focus mechanism (e.g., complementary thread sets) can be provided on lens holder 306 and lens assembly 308 to properly position lens assembly 308 with respect to sensor array area 304. In any case, when lens assembly 308 is properly positioned and focused, lens assembly 308 is rigidly fixed to lens holder 306 (e.g., by an adhesive 316) to maintain the desired focal position.

Camera module 300 can also includes an optional protective component over sensor array area 304. For example, a protective cover 318, such as a glass sheet, can be applied over sensor array area 304 before or after lens holder 306 is mounted on image capture device 302. In the event that protective cover 318 is applied before lens holder 306 is mounted, lens holder 306 can be adapted to retain protective cover 318 in position once lens holder 306 is formed on image capture device 302.

To facilitate electrical connections to a host electronic device (e.g., cell phone, PDA, etc.), image capture device 302 includes a plurality of electrical contacts 320, which enable image capture device 302 (and thus camera module 300) to be electrically coupled to a printed circuit board (PCB) 322 of the host device. In the present embodiment, electrical contacts 320 are conductive pads formed on the bottom surface of image capture device 302. Electrical contacts 320 are electrically connected to a plurality of complementary electrical contacts 324, formed on PCB 322, by solder balls 326, which also mechanically affix camera module 300 to PCB 322. In addition, electrical contacts 320 are coupled with the electronic circuitry (not shown) of image capture device 302 by a plurality (only 2 shown) of vias 328 formed through image capture device 302. It should be noted that vias 328 may be formed at various stages of manufacture of image capture device 302 using a variety of methods, including but not limited to, drilling and chemical etching. Finally, PCB 322 can be attached to the host device using any of a variety of methods known in the art.

One significant advantage of the camera module 300 is that the size of camera module 300 is significantly reduced as compared to the prior art. In particular, lens holder 306 is formed within the peripheral limits of top surface 310 of image capture device 302. Therefore, the footprint of camera module 300 is no larger than the lateral dimensions of image capture device 302. Furthermore, reducing the size of lens holder 306 also reduces the material cost associated with manufacturing lens holder 306.

Figure 17:
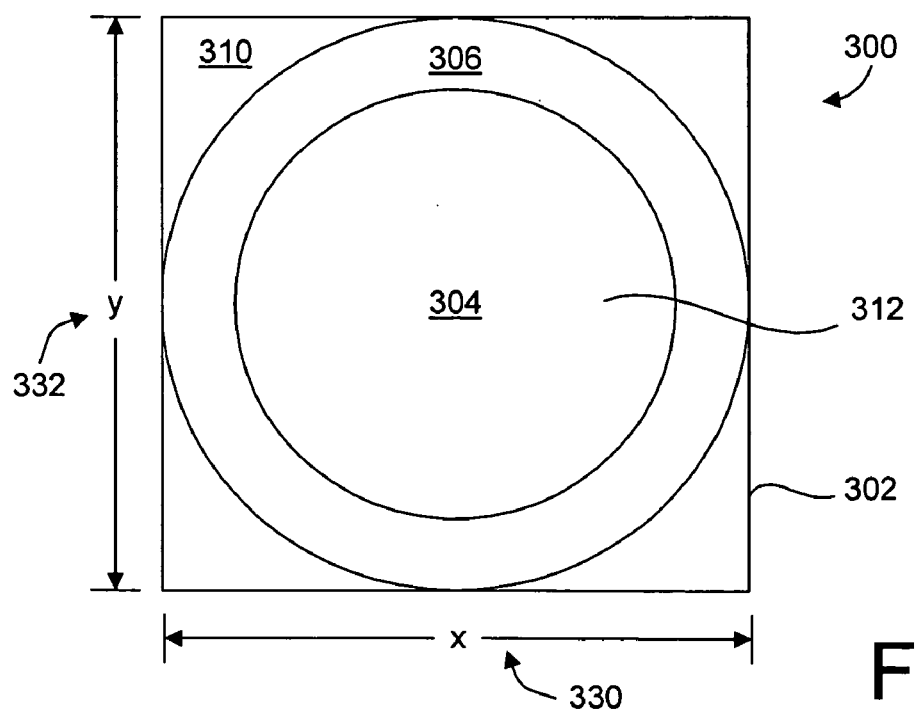
FIG. 17 is a top plan view of the camera module of FIG. 16.

FIG. 17 is a diagrammatic top plan view of camera module 300 having lens assembly 308 removed therefrom. As shown in FIG. 17, lens holder 306 is a cylindrical shell housing formed within the peripheral limits of the top surface 310 of image capture device 302. Therefore, lens holder 306 does not extend beyond the footprint of image capture device 302 in an X dimension 330 and a Y dimension 332. Although in the present embodiment the width/diameter of lens holder 306 is substantially equal to the width of image capture device 302, it should be understood that lens holder 306 does not need to extend to the edges of image capture device 302. Lens holder 306 also does not need to be circular. Indeed, although the particular structure shown is believed to be advantageous, lens holder 306 can have any suitable shape, as may be dictated by particular applications.

Note that lens holder 306 generally surrounds, but does not block, sensor array area 304. Lens holder 306 is positioned with respect to sensor array area 304 so that when lens assembly 308 is disposed in recess 312, the wall of lens holder 306 positions (e.g., centers) lens assembly 308 with respect to sensor array area 304. Therefore, an image transmitted by lens assembly 308 will be in proper lateral alignment with sensor array area 304.

Figure 18A:
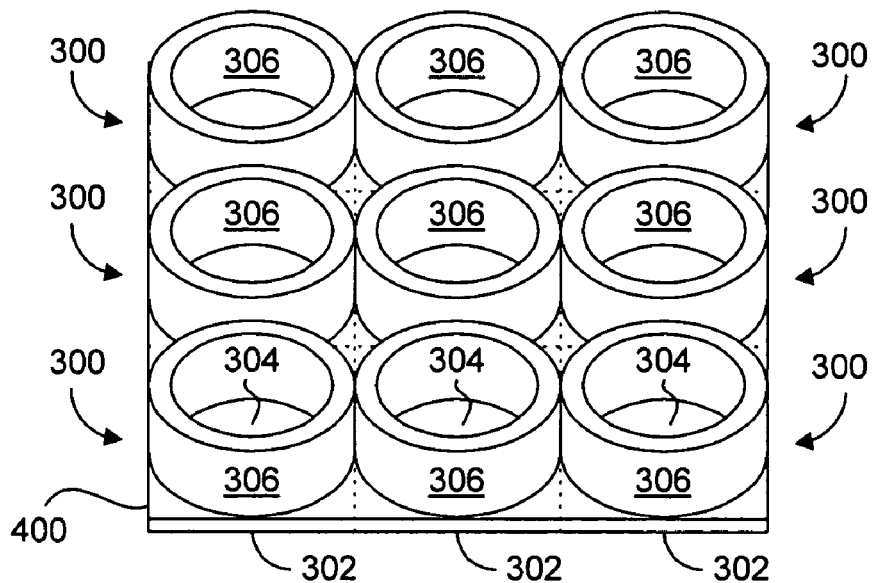
FIG. 18A is a perspective view of a portion of a substrate including a plurality of image capture devices, each having a molding formed thereon.

FIG. 18A is a perspective view of a portion of a substrate 400 (e.g., a silicon wafer) having a plurality (nine in this particular example) of discrete image capture devices 302 formed thereon, each having a sensory array area 304. In addition, each of a plurality of lens holders 306 are formed entirely on a respective one of image capture devices 302 within its peripheral limits. After image capture devices 302 are formed on substrate 400, lens holders 306 are simultaneously formed on their respective image capture devices 302 in a single mold operation. Image capture devices 302 can then be separated from one another (singualtion process) to produce a plurality of individual camera modules 300.

The integrated camera modules 300 of FIG. 18A are shown without lens assemblies 308 mounted in lens holders 306. It should be noted, however, that lens assemblies 308 can be mounted in lens holders 306 before or after camera modules 300 are separated from one another. For example, lens assemblies 308 can be inserted in lens holders 306 after lens holders 306 are formed on wafer 400, but before wafer 400 is divided. In fact, lens assemblies 308 will protect sensor array areas 304 from contamination during the singulation process if they are positioned in lens holders 306 before wafer 400 is divided.

Forming lens holders 306 simultaneously on wafer 400 provides an important advantage. In particular, forming a plurality of lens holders 306 during wafer fabrication in a single step saves manufacturing time and eliminates fabrication errors inherent in the process of forming lens holder 306 after camera chip 312 is separated from wafer 400. As a result, the yield of usable camera modules 300 is significantly increased.

Figure 18B:
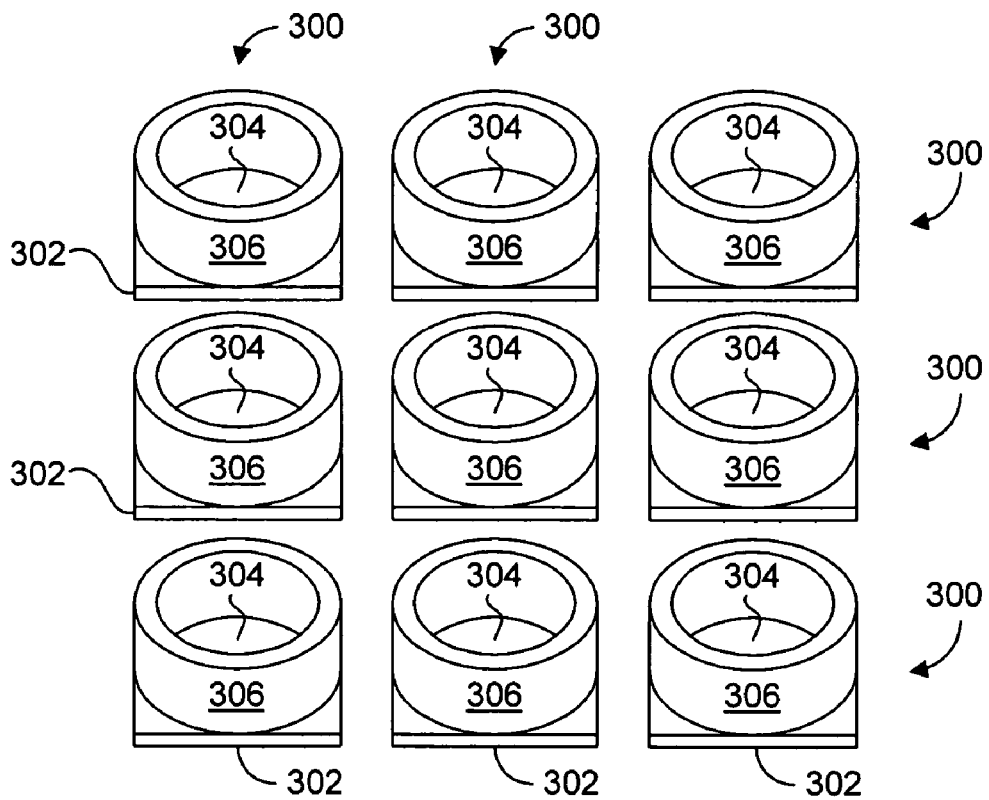
FIG. 18B is a perspective view of the substrate of FIG. 18A after singulation.

FIG. 18B is a perspective view of substrate 400 after it has been divided into a plurality of individual camera modules 300. Because lens holders 306 are formed during the fabrication of wafer 400 and fixed directly to image capture devices 302, camera modules 300 can be mounted directly on a PCB (e.g., PCB 322) as a single component by conventional component placement equipment and processes, without worrying about the alignment between lens holder 306 and image capture device 302. It should be noted, however, that it is within the scope of aspects of the present invention that lens holder 306 may be formed on image capture device 302 after substrate 400 is divided and/or after image capture device 302 has been mounted on a PCB or other substrate.

Figure 19:
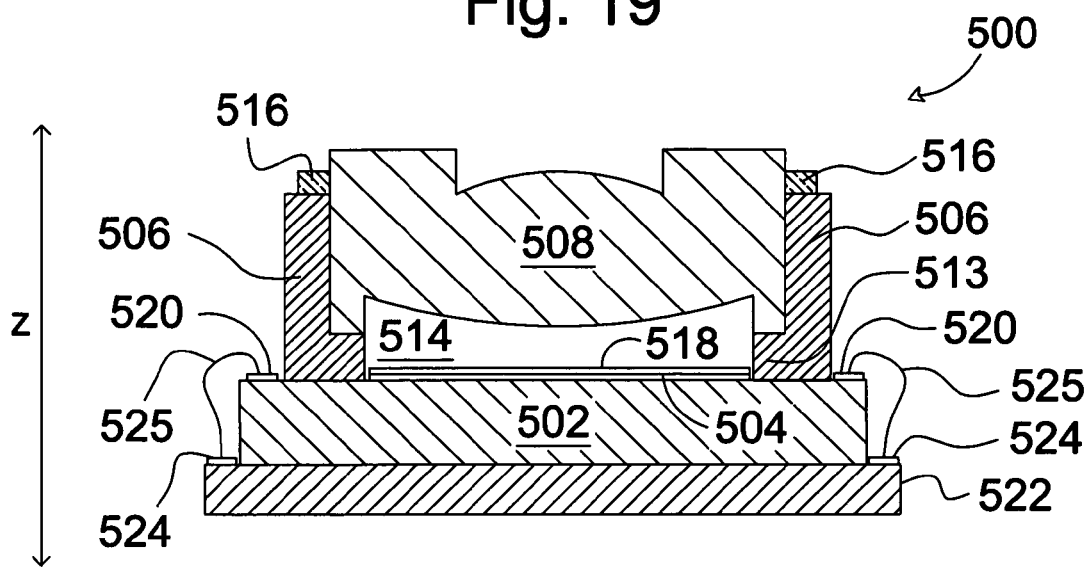
FIG. 19 is a cross-sectional side elevational view of a camera module and lens assembly according to yet another embodiment of the present invention.

FIG. 19 is a cross-sectional, side elevational view of an alternate camera module 500, according to another aspect of the present invention. Camera module 500 includes an image capture device 502 (e.g., a camera integrated circuit chip) having a sensor array area 504, a lens holder 506 (e.g., a molded housing) formed entirely on image capture device 502, and a lens assembly 508 positioned within lens holder 506. Like lens holder 306, lens holder 506 is formed on the top surface 510 (FIG. 20) of image capture device 502 within the peripheral limits of top surface 510. In addition, like sensor array area 304, sensor array area 504 is operative to convert an optical image passing through lens assembly 508 into electronic image data.

In the present embodiment, lens holder 506 and lens assembly 508 include an alternate focal alignment feature. In particular, lens holder 506 defines a recess 512 and a projection 513. Recess 512 receives lens assembly 508 and laterally positions lens assembly 508 with respect to sensor array area 504. Projection 513 supports lens assembly 508 and serves as a reference surface to position lens assembly 508 a predetermined height above sensor array area 504, thereby properly focusing the image produced by lens assembly 508 on sensor array area 504. In addition, projection 513 prevents inadvertent contact between lens assembly 508 and image capture device 502, thereby providing a protective gap 514 between lens assembly 508 and sensor array area 504. Once lens assembly 508 is properly positioned, abutting projection 513, an adhesive 516 is provided to prevent relative movement between lens assembly 508 to image capture device 502.

Like camera module 300, camera module 500 also includes an optional protective component over sensor array area 504. For example, a protective cover 518, such as a glass sheet, can be applied over sensor array area 504 before, during, or after the attachment of lens holder 506 to image capture device 502. In the event that protective cover 518 is applied before or during the attachment of lens holder 506, lens holder 506 can be adapted to hold protective cover 518 in place.

Another difference between camera module 300 and camera module 500 is the placement of the electrical contact pads. Instead of being formed on the bottom surface of image capture device 502, camera module 500 includes a plurality of electrical contacts 520 (e.g., wire bond pads) formed around the perimeter of image capture device 502 on its top surface 510. Electrical contacts 520 are electrically coupled via wires 525 to electrical contacts 524 on PCB 522. As long as there is enough room on top surface 510, forming contacts 520 on top surface 510 eliminates the need to create vias through to the rear surface of image capture device 502.

Figure 20:
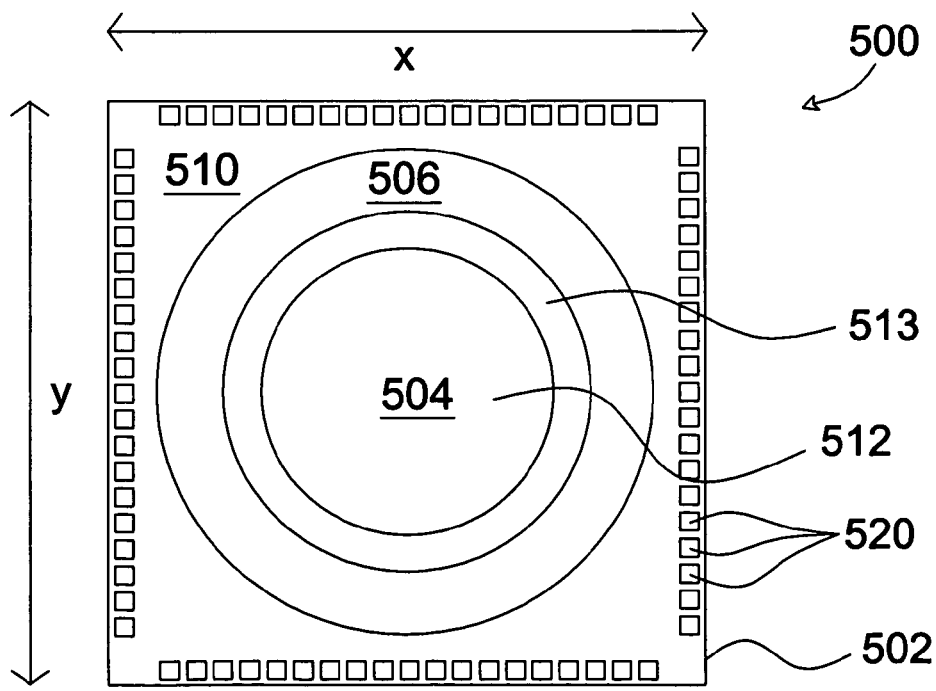
FIG. 20 is a top plan view of the camera module of FIG. 19.

FIG. 20 is a diagrammatic top plan view of camera module 500 having lens assembly 508 removed therefrom. As shown in FIG. 20, lens holder 506 is a cylindrical housing formed within the peripheral limits of the top surface 510 of image capture device 502. Because the width/diameter of lens holder 506 is somewhat smaller that the width of image capture device 502, lens holder 506 does not block any of electrical contacts 520 formed on the top surface 510 of image capture device 502.

FIG. 20 also shows a top view of protrusion 513. Protrusion 513 is generally circular such that lens assembly 508 is supported all around its circumference thereby. It should be noted, however, that the reference surface of projection 513 can be modified to include "steps" or inclined sections, in order to provide an adjustable focus mechanism.

Figure 21:
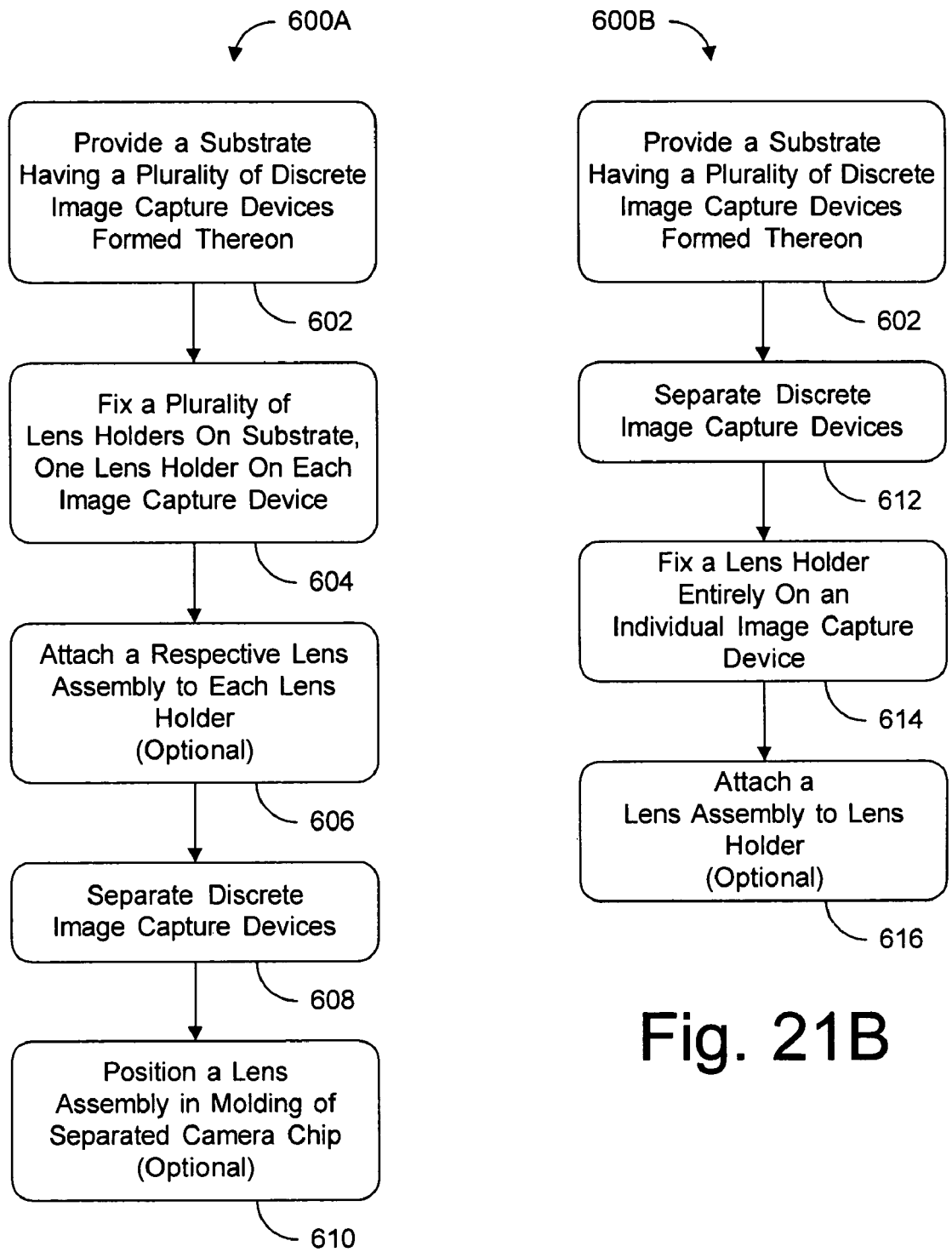
FIG. 21A is a flow chart summarizing a method for manufacturing camera modules according to the present invention.
FIG. 21B is a flow chart summarizing another method for manufacturing camera modules according to the present invention.

Methods of the present invention will now be described with respect to FIGS. 21A-22. For the sake of clear explanation, these methods are described with reference to particular elements of the previously described embodiments that perform particular functions. However, it should be noted that other elements, whether explicitly described herein or created in view of the present disclosure, could be substituted for those cited without departing from the scope of the present invention. Therefore, it should be understood that the methods of the present invention are not limited to any particular element(s) that perform(s) any particular function(s). Further, some steps of the methods presented need not necessarily occur in the order shown. For example, in some cases two or more method steps may occur in a different order or simultaneously. In addition, some steps of the described methods may be optional (even if not explicitly stated to be optional) and, therefore, can be omitted. These and other variations of the methods disclosed herein will be readily apparent, especially in view of the description of the present invention provided previously herein, and are considered to be within the full scope of the invention.

FIG. 21A is a flowchart summarizing a method 600A for manufacturing a camera module (e.g., camera module 300) according to one embodiment of the present invention. In a first step 602, a substrate (e.g., substrate 400) having a plurality of discrete image capture devices 302 formed thereon is provided. Then, in a second step 604, a plurality of lens holders 306 (e.g., molded housings) are fixed on substrate 400, such that each lens holder 306 is fixed on a respective one of the discrete image capture devices 302. Next, in an optional third step 606, a lens assembly 308 is attached to each of the lens holders 306. Then, in a fourth step 608, the discrete image capture devices 302 are separated from one another, such that a plurality of individual camera modules 300 is produced. Finally, in an optional fifth step 610, a lens assembly 308 is positioned in lens holder 306, if a lens assembly 308 was not positioned in lens holder 306 during third step 606.

FIG. 21B is a flowchart summarizing another method 600B for manufacturing a camera module 300. In a first step 602 a substrate (e.g., substrate 400) is provided having a plurality of discrete image capture devices 302 formed thereon. Then, in a second step 612, the discrete image capture devices 302 are separated from one another into a plurality of individual image capture devices 302. Next, in a third step 614, a lens holder 306 is formed entirely on an individual image capture device 302 to form a camera module 300. Finally, in an optional fourth step 616, a lens assembly 308 is attached to lens holder 306.

Figure 22:
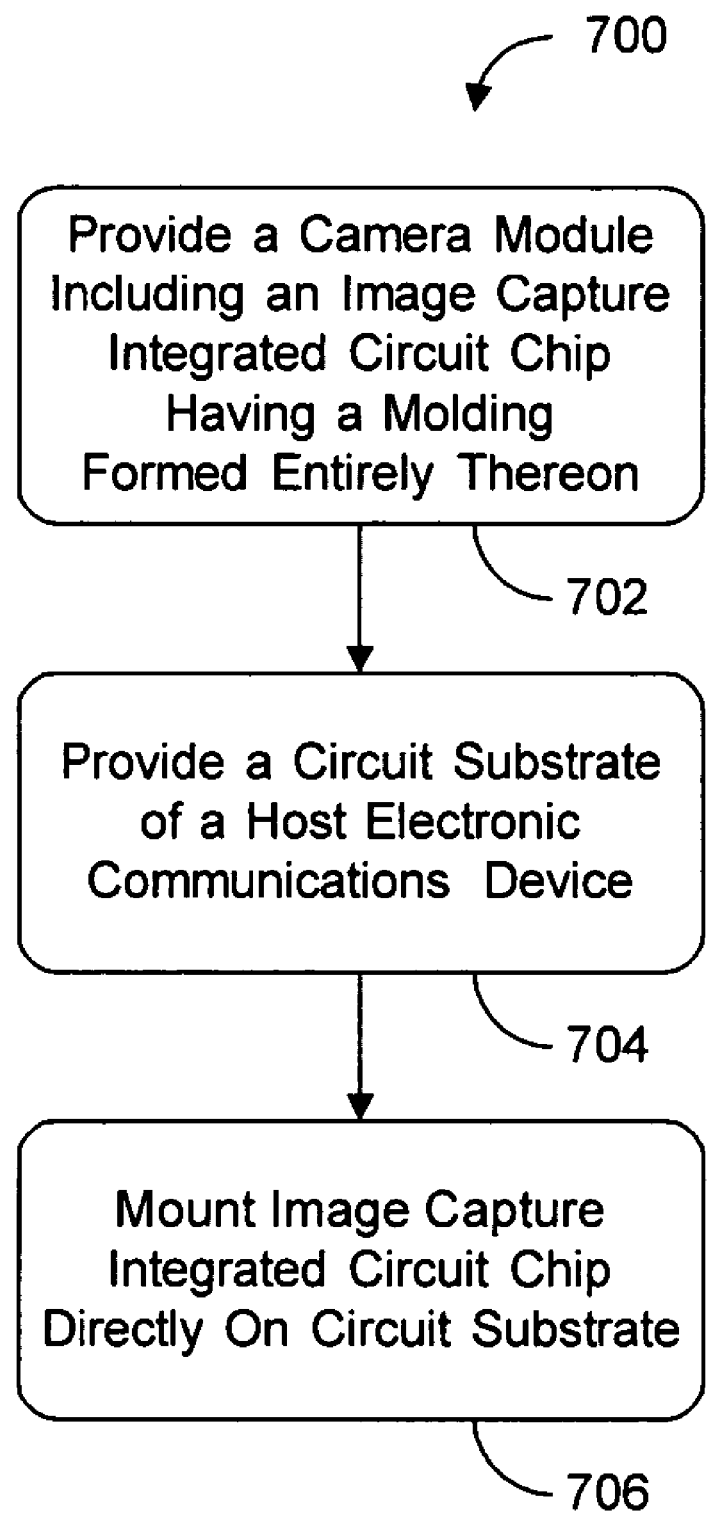
FIG. 22 is a flow chart summarizing a method of mounting a camera module to a host electronic communications device according to the present invention.

FIG. 22 is a flowchart summarizing a method 700 for mounting a camera module of the present invention to a circuit substrate (e.g., a PCB, flexible circuit substrate, etc.) of a host electronic communications device. In a first step 702, a camera module (e.g., camera module 300) including a image capture device 302 with a lens holder 306 formed entirely thereon is provided. Then, in a second step 704, a circuit substrate (e.g., PCB 322) of a host device is provided. Finally, in a third step 706, camera module 300 is mounted directly to PCB 322, for example, by soldering electrical contacts 320 of image capture device 302 to complementary electrical contacts 324 of PCB 322.

It should be noted that although methods 600A, 600B, and 700 are described with reference to camera module 300 shown in FIGS. 16-18B, these methods also apply to camera module 500 shown in FIGS. 19 and 20, as well as other camera modules not specifically described herein.

Various modifications may be made to the invention without altering its value or scope. For example, the sizes, shapes and quantities of components shown and described in relation to the examples discussed herein could each or all be varied according the needs or convenience of a particular application.

Similarly other substrate materials, such as ceramics, could be used instead of the PCB 16 described herein.

Another modification would be to replace the air filled gap 30 described herein with an optically clear spacer made, for example, of clear plastic, glass, or some other optically acceptable material. Providing a spacer which abuts both the camera chip 12 and the lens 24 could eliminate the need to focus the lens during the lens mounting operation. Also, secondary lenses, such as zoom lens assemblies and the like, can be fit to the already mechanically centered lens assembly 24 or 24a. A spacer would also serve as a protective cover, thereby eliminating the need to provide a separate protective cover.

While the inventors presently believe that mounting the lens assemblies 24, 24a into the molding 26, or the like, by an adhesive is the most viable method, it is within the scope of the invention that the lens assemblies 24, 24a could be secured to the PCB 16, 16a in relation to the camera chip 12 by other mechanical means, such as a mechanical clip, or the like.

Obvious variations to the method could include mounting the lens assemblies 24a into the molding 26 before the "saw singulation" operation 134. Of course, this would require some other modifications to the method to insure that the sensor array area 14 is protected during the "saw singulation" operation 134, and the like.

Additional components and/or parts could readily be added to the present invention. One possible example would be to provide a glass cover on the molding 26. Such a cover might serve several purposes. It could protect the sensor array area 14 during storage, transport and handling, it could optionally provide a service whereby the device could be lifted by "pickand-place" machines, and it could protect the sensor array area 14 during reflow soldering operations.

Those skilled in the art will also realize that modifications (including those described above) can be made to camera modules 300 and 500 without departing from the scope of the present invention. For example, wafer 400 will likely include a greater or lesser number of image capture devices 302. As another example, a single protective cover could be placed over wafer 400, such that when wafer 400 is divided, each camera module 300 would include a portion of the protective cover. As yet another example, a second protective cover might be placed over lens holders 306 when wafer 400 is divided such that debris does not enter lens holders 306. As still another example, lens assemblies 308 can be positioned in lens holders 306 at any time after lens holders 306 are formed, for example prior to singulation, after singulation but prior to a camera module 300 being mounted on PCB 322, or after camera module 300 is mounted PCB 322.

All of the above are only some of the examples of available embodiments of the present invention. Those skilled in the art will readily observe that numerous other modifications and alterations may be made without departing from the spirit and scope of the invention. Accordingly, the disclosure herein is not intended as limiting and the appended claims are to be interpreted as encompassing the entire scope of the invention.

INDUSTRIAL APPLICABILITY

The inventive integrated camera module 10, 10*a*, is intended to be widely used for capturing visual images in very small devices such as small digital cameras, cellular telephones, and the like. The device and method are appropriate to a wide variety of applications, including using sensor modules ranging from VGA resolution to 1.3 Megapixel or even greater. The method and apparatus described herein are inexpensive in the molding material and process is lower in cost as compared to the attachment of a housing using conventional methods. This is mainly because the molding process will likely be performed on an entire panel having thereon a large number of the integrated camera modules 10 at once, rather than attaching the lenses one at a time. Also, the cost of molding compound will be lower than the cost of individual housing pieces formerly used for attaching the lenses.

In addition, in the case of camera modules 300 and 500, a plurality of lens holders 306 and 506 can be formed simultaneously on a wafer 400 of image capture devices 302 and 502, respectively. Doing so significantly reduces the size of lens holders 306 and 506 the time required to manufacture camera modules 300 and 500, and the overall cost.

According to the present invention, the final assembly of the camera modules 10, 300, and 500 will be more robust and more accurate with respect to X and Y locations. This is accomplished by ensuring that the sensor die placement and the overmold insert locations are controlled by the same local fiducial features on the substrate. Current methods involve the use of guide pins and other means for the placement of the housing. These inherently involve greater tolerance build up compared to a mold with greater dimensional accuracy and more stable dimensions.

As discussed previously herein, Z dimension accuracy will be accomplished with reference to the surface of camera chip 12, 302, 502 itself, which is the key reference for camera focus. It is anticipated that, in the future, this will obviate the need for active alignment in most cases. Also, the fact that the alignment is done without having to rotate the lens assembly into a threaded housing will inherently make the lens placement more stable.

It is further anticipated that the reduction in the required number of components according to the present invention will, itself, result in additional cost savings.

Since the camera modules 10, 10*a*, 300, 500 of the present invention may be readily produced and integrated with existing design configurations for camera systems and others yet to be conceived, and since the advantages as described herein are provided, it is expected that it will be readily accepted in the industry. For these and other reasons, it is expected that the utility and industrial applicability of the invention will be both significant in scope and long-lasting in duration.

We claim:

1. A camera module comprising:
    an image capture integrated circuit chip;
    a lens; and
    a lens holder made on said image capture integrated circuit chip, whereby said lens is positioned relative to said image capture integrated circuit chip by the lens holder; and wherein
    said image capture integrated circuit chip is a bare chip;
    said lens holder is made on a top surface of said image capture integrated circuit chip; and
    said lens holder is made entirely within the peripheral limits of said top surface of said bare image capture integrated circuit chip.

2. A camera module according to claim 1, further comprising a protective cover disposed over a sensor array of said image capture integrated circuit chip.

3. A camera module according to claim 1, wherein said lens holder is molded on said top surface of said image capture integrated circuit chip.

4. A camera module according to claim 1, wherein said lens holder defines a recess for receiving said lens.

5. A camera module according to claim 4, wherein said recess positions said lens relative to said image capture integrated circuit chip when said lens is placed in said recess.

6. A camera module according to claim 5, wherein said lens holder includes a reference surface for fixing the distance of said lens from said image capture integrated circuit chip.

7. A camera module according to claim 1, wherein said lens is affixed to said housing such that there is a gap between at least a portion of said lens and said image capture integrated circuit chip.

8. A camera module according to claim 1, wherein said lens is coupled to said lens holder via an adjustable focus mechanism.

9. A camera module according to claim 1, wherein said lens is a component of a lens assembly.

10. A camera module according to claim 1, wherein:
    said image capture integrated circuit chip includes a photosensitive area and a non-photosensitive area; and
    said lens holder is mounted on said non-photosensitive area so as not to occlude said photosensitive area.

11. A camera module according to claim 1, further including at least one electrical contact disposed to electrically couple said image capture integrated circuit chip to an electronic device.

12. A camera module according to claim 11, wherein said at least one electrical contact is disposed on an exposed portion of a surface of said image capture integrated circuit chip upon which said lens holder is made.

13. A camera module according to claim 11, wherein:
    said lens holder is formed on said top surface of said image capture integrated circuit chip; and
    said at least one electrical contact is formed on a bottom surface of said image capture integrated circuit chip.

14. A method for manufacturing camera modules, said method comprising:

providing a substrate having a plurality of discrete image capture devices formed thereon; and making a plurality of lens holders on said substrate, each of said lens holders being made on a respective one of said plurality of image capture devices; and wherein said step of providing said substrate includes providing a silicon wafer having said plurality of discrete image capture devices formed thereon, said image capture devices being bare chips; and said step of making said plurality of lens holders on said substrate includes making each of said plurality of lens holders entirely within the peripheral limits of said respective one of said bare image capture devices.

15. A method according to claim 14, wherein said step of making said lens holders on said substrate includes molding said plurality of lens holders on said substrate.

16. A method according to claim 15, wherein said step of molding said plurality of lens holders on said substrate includes simultaneously molding said plurality of lens holders on said substrate.

17. A method according to claim 14, further comprising separating said plurality of discrete image capture devices after said step of making said plurality of lens holders on said substrate.

18. A method according to claim 14, further comprising placing a protective cover over each of said plurality of discrete image capture devices.

19. A method according to claim 18, wherein said step of placing said protective cover over each of said plurality of image capture devices occurs during said step of making said plurality of lens holders on said substrate.

20. A method according to claim 18, wherein said protective cover is a molded spacer.

21. A method according to claim 18, wherein said protective cover is glass.

22. A method according to claim 14, wherein said step of making said plurality of lens holders includes forming a lens receiving recess in each of said plurality of lens holders.

23. A method according to claim 22, further comprising positioning a respective lens unit into said lens receiving recess of each of said plurality of lens holders.

24. A method according to claim 23, wherein said step of positioning said lens units includes abutting each of said lens units against a reference surface of a respective one of said lens holders to fix the distance between said lens unit and said image capture device.

25. A method according to claim 23, wherein said step of positioning said lens units in said lens holders occurs while said discrete image capture devices are still an integral part of said substrate.

26. A method according to claim 14, further comprising attaching a respective lens to each of said plurality of lens holders.

27. A method according to claim 26, wherein said step of attaching said lenses to said lens holders occurs while said discrete image capture devices are still an integral part of said substrate.

28. A method according to claim 26, further comprising focusing said lenses while said discrete image capture devices are still an integral part of said substrate.

29. A method according to claim 14, wherein each of said plurality of image capture devices includes:

an image capture circuit disposed on a top surface of said image capture device; and an electrical contact formed on a bottom surface of said image capture device.

30. A method according to claim 29, wherein each of said image capture devices includes a via through said substrate to connect said image capture circuit with said electrical contact.

31. A method according to claim 29, wherein a width of said lens holder is substantially the same as a width of a respective one of said image capture devices.

32. A method according to claim 14, further comprising:

separating said discrete image capture devices from one another; and wherein said step of making said plurality of lens holders on said substrate includes making a lens holder entirely on at least one of said plurality of individual image capture devices after said step of separating said discrete image capture devices.

33. A silicon wafer including:

a plurality of discrete image capture devices; and a plurality of lens holders, each made on a respective one of said image capture devices; and wherein each of said plurality of discrete image capture devices is a bare image capture chip; and each of said plurality of lens holders is made entirely on a top surface of said respective image capture device within the peripheral limits of said top surface.

34. A silicon wafer according to claim 33, further including a plurality of protective covers each disposed over a respective one of said plurality of image capture devices.

35. A silicon wafer according to claim 34, wherein said protective covers are molded spacers.

36. A silicon wafer according to claim 34, wherein said protective covers are glass.

37. A silicon wafer according to claim 33, wherein each of said plurality of lens holders includes a lens receiving recess.

38. A silicon wafer according to claim 37, further comprising a respective lens unit disposed in each of said lens receiving recesses.

39. A silicon wafer according to claim 38, wherein said lens holders each include a reference surface for positioning said lens units with respect to said image capture device.

40. A silicon wafer according to claim 33, further including a plurality of lens units, each mounted to a respective one of said plurality of lens holders.

41. A silicon wafer according to claim 40, wherein said lens units are mounted to said lens holders such that there is a gap between said lens units and said image capture devices.

42. A silicon wafer according to claim 33, wherein each of said plurality of discrete image capture devices includes:

an image capture circuit disposed on said top surface of said image capture device; and an electrical contact formed on a bottom surface said image capture device.

43. A silicon wafer according to claim 42, wherein a maximum width of each of said lens holders is substantially the same as a maximum width of respective ones of said image capture devices.

44. A silicon wafer according to claim 42, wherein each of said image capture devices includes a via through said silicon wafer to connect said image capture circuits with said electrical contacts.

45. An electronic communications device comprising:
communication circuitry for providing communication with another electronic communications device; and
a camera module including
    an image capture integrated circuit chip having a photosensitive area, said image capture integrated circuit chip being a bare chip; and
    a housing made entirely on said bare image capture integrated circuit chip within the peripheral limits of a top surface of said bare image capture integrated circuit chip, said top surface including said photosensitive area.

46. An electronic communications device according to claim 45, further comprising:
    a circuit substrate including at least a portion of said communication circuitry; and wherein
    said camera module is mounted on said circuit substrate.

* * * * *